United States Patent
Kikuchi

(10) Patent No.: US 8,773,561 B2
(45) Date of Patent: Jul. 8, 2014

(54) SOLID-STATE IMAGE PICKUP APPARATUS AND ELECTRONIC APPARATUS

(75) Inventor: Koji Kikuchi, Tokyo (JP)

(73) Assignee: Sony Corporation, Tokyo (JP)

( * ) Notice: Subject to any disclaimer, the term of this patent is extended or adjusted under 35 U.S.C. 154(b) by 275 days.

(21) Appl. No.: 12/659,259

(22) Filed: Mar. 2, 2010

(65) Prior Publication Data

US 2010/0245645 A1 Sep. 30, 2010

(30) Foreign Application Priority Data

Mar. 31, 2009 (JP) ................................. 2009-084143

(51) Int. Cl.
*H04N 3/14* (2006.01)
*H04N 5/335* (2011.01)
*H01L 21/00* (2006.01)
*H01L 27/00* (2006.01)

(52) U.S. Cl.
USPC ............. 348/308; 348/294; 348/302; 438/57; 438/64; 438/65; 438/66; 250/208.1

(58) Field of Classification Search
USPC ................................ 250/208.1; 348/294–324
See application file for complete search history.

(56) References Cited

U.S. PATENT DOCUMENTS

| | | | | |
|---|---|---|---|---|
| 5,844,290 A * | 12/1998 | Furumiya | ...................... | 257/432 |
| 6,577,342 B1 * | 6/2003 | Wester | ........................... | 348/340 |
| 6,614,479 B1 * | 9/2003 | Fukusho et al. | .............. | 348/340 |
| 6,791,153 B2 * | 9/2004 | Kashiura | ........................ | 257/458 |
| 6,821,809 B2 * | 11/2004 | Abe et al. | ......................... | 438/65 |
| 7,041,956 B2 * | 5/2006 | Takahashi et al. | .......... | 250/208.1 |
| 7,259,791 B2 * | 8/2007 | Fukusho et al. | .............. | 348/340 |
| 7,504,681 B2 * | 3/2009 | Lim | ................................ | 257/294 |
| 7,675,096 B2 * | 3/2010 | Takahashi et al. | ............. | 257/292 |
| 7,701,029 B2 * | 4/2010 | Mabuchi | ........................ | 257/462 |
| 7,859,027 B2 * | 12/2010 | Uya | ................................ | 257/228 |
| 7,968,888 B2 * | 6/2011 | Yamaguchi et al. | ............ | 257/72 |
| 7,985,947 B2 * | 7/2011 | Noda | ........................... | 250/214.1 |
| 7,999,293 B2 * | 8/2011 | Okumura et al. | ............. | 257/292 |
| 8,004,020 B2 * | 8/2011 | Kawasaki | ...................... | 257/222 |
| 8,253,142 B1 * | 8/2012 | Harada et al. | .................... | 257/72 |
| 2001/0054677 A1 * | 12/2001 | Nakashima | ................ | 250/208.1 |
| 2003/0057448 A1 * | 3/2003 | Fujinawa et al. | ............. | 257/200 |
| 2003/0168709 A1 * | 9/2003 | Kashiura | ....................... | 257/458 |
| 2003/0214595 A1 * | 11/2003 | Mabuchi | ........................ | 348/294 |
| 2004/0012707 A1 * | 1/2004 | Fukusho et al. | ............. | 348/340 |
| 2004/0246351 A1 * | 12/2004 | Hiatt et al. | ...................... | 348/272 |
| 2005/0122417 A1 * | 6/2005 | Suzuki | ........................... | 348/340 |
| 2006/0033827 A1 * | 2/2006 | Kanbe et al. | .................. | 348/302 |
| 2006/0049476 A1 * | 3/2006 | Koizumi et al. | ............. | 257/432 |

(Continued)

FOREIGN PATENT DOCUMENTS

JP 2008-270679 11/2008

*Primary Examiner* — Michael Osinski
(74) *Attorney, Agent, or Firm* — Rader, Fishman & Grauer PLLC

(57) ABSTRACT

A solid-state image pickup apparatus includes a photoelectric converter, a wiring portion, a micro lens, and an adjustment film. The photoelectric converter is formed on a light incident side in a substrate. The wiring portion is formed on a side of the substrate that is opposite to the light incident side. The micro lens is formed on a light incident side of the photoelectric converter. The adjustment film adjusts variation of a light reception sensitivity in the photoelectric converter with respect to a wavelength of light that enters the photoelectric converter through the micro lens, and the adjustment film is formed between the photoelectric converter and the micro lens.

8 Claims, 9 Drawing Sheets

(56) References Cited

U.S. PATENT DOCUMENTS

| | | | |
|---|---|---|---|
| 2006/0086956 A1* | 4/2006 | Furukawa et al. | 257/291 |
| 2006/0138577 A1* | 6/2006 | Hashimoto | 257/432 |
| 2007/0091190 A1* | 4/2007 | Iwabuchi et al. | 348/294 |
| 2007/0210395 A1* | 9/2007 | Maruyama et al. | 257/431 |
| 2008/0090323 A1* | 4/2008 | Wu | 438/70 |
| 2008/0170149 A1* | 7/2008 | Iida et al. | 348/315 |
| 2009/0078974 A1* | 3/2009 | Nagai et al. | 257/292 |
| 2009/0090988 A1* | 4/2009 | Ohgishi | 257/432 |
| 2009/0104729 A1* | 4/2009 | Koizumi et al. | 438/69 |
| 2009/0185060 A1* | 7/2009 | Akiyama | 348/294 |
| 2009/0190016 A1* | 7/2009 | Iida | 348/308 |
| 2009/0206434 A1* | 8/2009 | Hashimoto | 257/432 |
| 2010/0026866 A1* | 2/2010 | Matsumoto et al. | 348/308 |
| 2011/0108705 A1* | 5/2011 | Izuha et al. | 250/208.1 |
| 2011/0156114 A1* | 6/2011 | Park et al. | 257/294 |
| 2011/0272746 A1* | 11/2011 | Suzuki | 257/222 |
| 2012/0008024 A1* | 1/2012 | Takimoto | 348/294 |
| 2012/0012962 A1* | 1/2012 | Tseng et al. | 257/432 |

* cited by examiner

SOLID-STATE IMAGE PICKUP APPARATUS AND ELECTRONIC APPARATUS

BACKGROUND OF THE INVENTION

1. Field of the Invention

The present invention relates to a solid-state image pickup apparatus and an electronic apparatus. In particular, the present invention relates to a solid-state image pickup apparatus including a photoelectric converter formed on a light incident side in a substrate and a wiring portion formed on a side opposite to the light incident side and having a film that adjusts light reception sensitivity in accordance with a wavelength on a light incident side of the photoelectric converter, and relates to an electronic apparatus.

2. Description of the Related Art

In a semiconductor image sensor typified by a CMOS (complementary metal oxide semiconductor) image sensor, the reduction in pixel size and the increase in number of pixels in the same image area are demanded. In Japanese Patent Application Laid-open No. 2008-270679 (hereinafter, referred to as Patent Document 1), there has been disclosed a technique of reducing an inter-lens area and preventing incident light from entering an adjacent pixel, thereby suppressing colors from mixing with each other in a so-called CMOS image sensor of a back-surface irradiation type.

SUMMARY OF THE INVENTION

In a solid-state image pickup apparatus, a noise component is increased with the increase in the number of pixels, so it becomes difficult to secure the same S/N ratio. To secure the S/N ratio, a CMOS image sensor of a back-surface irradiation type has been proposed as disclosed in Patent Document 1. The CMOS image sensor of a back-surface irradiation type receives light from a side (back side) opposite to a side on which a photoelectric converter is formed on a substrate. However, also in the CMOS image sensor of a back-surface irradiation type, the size of a photoelectric converter as a photodiode is reduced, and a sufficient sensitivity is difficult to be obtained. Further, the sensitivity significantly depends on a wavelength. Therefore, when a large ripple is found in a response spectrum, sensitivity deterioration is caused, and a balance of colors is lost, which causes a problem in forming an image.

In view of the above-mentioned circumstances, it is desirable to prevent the ripple and the deterioration of the sensitivity that depends on the wavelength in the solid-state image pickup apparatus of the back-surface irradiation type.

According to an embodiment of the present invention, there is provided a solid-state image pickup apparatus, including a photoelectric converter, a wiring portion, a micro lens, and an adjustment film. The photoelectric converter is formed on a light incident side in a substrate. The wiring portion is formed on a side of the substrate that is opposite to the light incident side. The micro lens is formed on a light incident side of the photoelectric converter. The adjustment film adjusts variation of a light reception sensitivity in the photoelectric converter with respect to a wavelength of light that enters the photoelectric converter through the micro lens, and the adjustment film is formed between the photoelectric converter and the micro lens. In addition, there is provided an electronic apparatus that uses the solid-state image pickup apparatus.

In the embodiment of the present invention, the adjustment film provided between the photoelectric converter and the micro lens adjusts the fluctuation of the light reception sensitivity in the photoelectric converter with respect to the wavelength of light that enters the photoelectric converter through the micro lens. Specifically, the adjustment is made so that the period of the variation of the average transmittance every 10-nm wavelengths of light is set to be smaller than a distance between a center wavelength (for example 540 nm) of blue light and a center wavelength (for example 450 nm) of green light. Thus, the fluctuation of the light reception sensitivity with respect to the wavelength is prevented from affecting the color balance.

Herein, as the adjustment film, one of a silicon oxide and a silicon oxynitride is used. Further, in a case where the silicon oxide is used as the adjustment film, a thickness thereof is set to 2000 nm or more.

According to the embodiment of the present invention, it is possible to prevent the ripple and the sensitivity deterioration that depends on the wavelength in the solid-state image pickup apparatus of a back-surface irradiation type. Further, even when the fluctuation of the light reception sensitivity with respect to the wavelength is caused, it is possible to prevent the fluctuation from affecting the image formation.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings. The description will be given in order of the following items.

1. Outline of solid-state image pickup apparatus (structure having CMOS image sensor of back-surface irradiation type and color filter)
2. Features of embodiment (structure of adjustment film, structure impedance matching, thickness of silicon oxide, and structure of antireflection film)
3. Electronic apparatus (example of image pickup apparatus)

<1. Outline of Solid-State Image Pickup Apparatus>

(CMOS Image Sensor of Back-Surface Irradiation Type)

Figure 1:
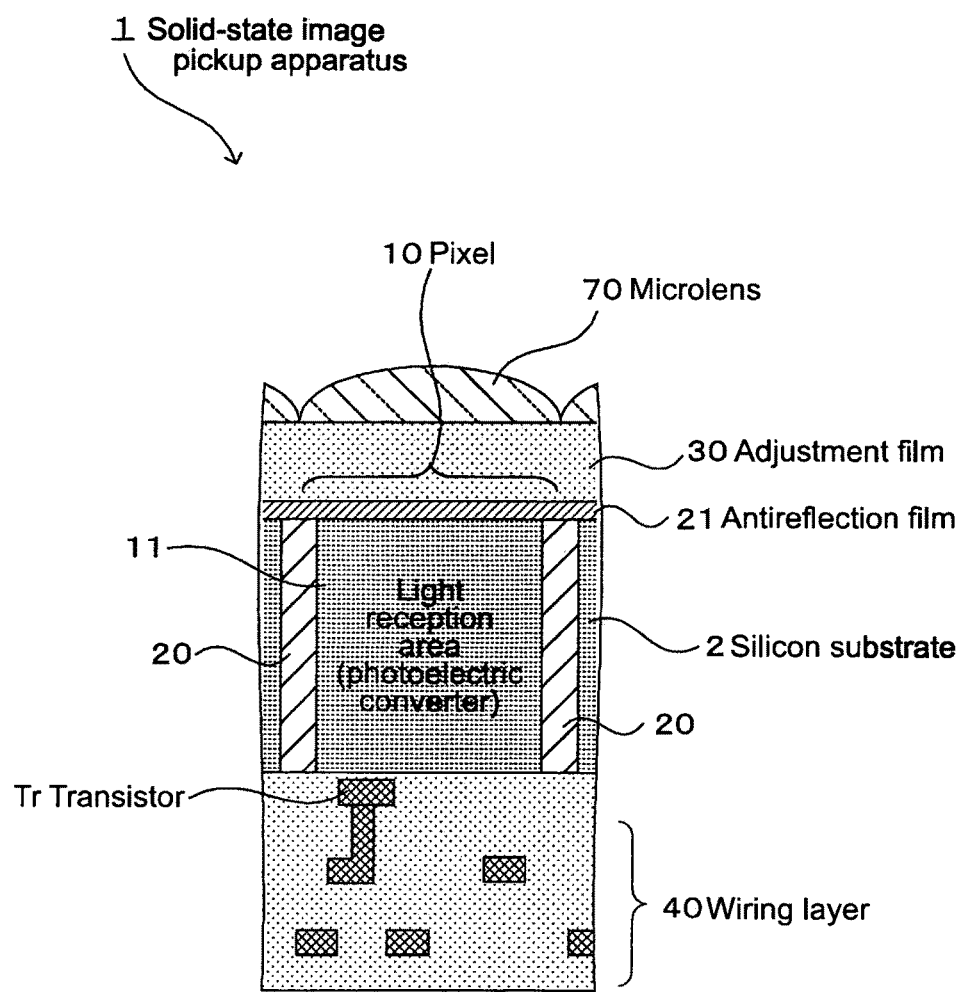
FIG. 1 is a schematic cross-sectional diagram for explaining an outline of a solid-state image pickup apparatus according to an embodiment.

FIG. 1 is a schematic cross-sectional diagram for explaining an outline of a solid-state image pickup apparatus according to an embodiment. A solid-state image pickup apparatus 1 of this embodiment is a so-called CMOS image sensor of a back-surface irradiation type. In the solid-state image pickup apparatus 1, one side (upper side in FIG. 1) of a silicon substrate 2 in which a light reception area (photoelectric converter) 11 that forms a pixel is provided corresponds to a light incident side. On the other side of the substrate 2, a wiring layer 40 for a signal obtained by performing photoelectric conversion in the light reception area 11 is provided. With this structure, light enters a surface opposite to a surface side on which the wiring layer 40 is provided and is subjected to the photoelectric conversion in the light reception area 11.

In the solid-state image pickup apparatus 1, the light reception area 11 of each color that is formed in the substrate 2 is separated by an element separation portion 20. On the light reception area 11, an antireflection film 21 and an adjustment film 30 are formed. On the adjustment film 30, a micro lens 70 is formed.

For manufacturing the so-called CMOS image sensor of a back-surface irradiation type as in this embodiment, on a surface (lower side in FIG. 1) of the substrate 2, the element separation portion 20 that separates the light reception area 11 is formed by performing a P-type ion implantation. Then, between the element separation portions 20, the light reception area 11 is formed by performing ion implantations of N-type and P-type impurities. In addition, on the substrate 2, a transistor Tr for pixel drive or the like and the wiring layer 40 are formed.

The transistor Tr includes various transistors such as a read transistor, an amplifier transistor, a selection transistor, and a reset transistor. The read transistor reads a charge taken in the light reception area 11. The amplifier transistor amplifies an output of a photodiode. The selection transistor selects a photodiode. The reset transistor discharges charges.

In this state, a support substrate is bonded on the side of the substrate 2, on which the wiring layer 40 is formed. In the state of being supported by the support substrate, the back surface (upper side in FIG. 1) of the substrate 2 is polished by a CMP (chemical mechanical polishing). The polishing process is continued until the light reception area 11 is exposed.

Subsequently, on the back surface of the substrate 2, from which the light reception area 11 is exposed, the antireflection film 21 (for example, HfO having a thickness of 64 nm) is formed, and the adjustment film 30 is formed. The adjustment film 30 is made of a silicon oxide or a silicon oxynitride. It is desirable to set a refractive index thereof to 1.46 or less.

Further, on the adjustment film 30, the micro lens 70 (having a lens thickness of 350 nm, for example) corresponding to the light reception area 11 is formed.

As a result, the solid-state image pickup apparatus 1 in which light enters the back surface (upper side in FIG. 1) of the substrate 2, is collected by the micro lens 70, and is received by the light reception area 11 is completed. In this structure, the wiring layer 40 is not provided on the light incident side of the light reception area 11, and therefore the aperture efficiency of each of the light reception areas 11 can be increased.

Generally, there has been proposed a structure in which a distance between the light reception area 11 and the micro lens 70 is minimized as much as possible or a structure in which a focal position of the micro lens 70 is set on the surface of the light reception area. However, in such structures, an impedance matching of the structure may not necessarily be increased within a visible light range. Herein, the impedance matching of the structure refers to an adjustment of the variation of the light reception sensitivity of the light reception area 11 with respect to a wavelength of incident light.

This embodiment is characterized in that the adjustment film 30 provided between the micro lens 70 and the light reception area 11 adjusts the variation of the light reception sensitivity on the light reception area 11 with respect to the wavelength of light that enters the light reception area 11 through the micro lens 70 (impedance matching of the structure). In this embodiment, with the structure in which the matching is conducted in accordance with a waveband of light handled in the solid-state image pickup apparatus, a higher light reception sensitivity is obtained as compared to a solid-state image pickup apparatus without the structure as described above.

(Structure Having Color Filter)

Figure 2:
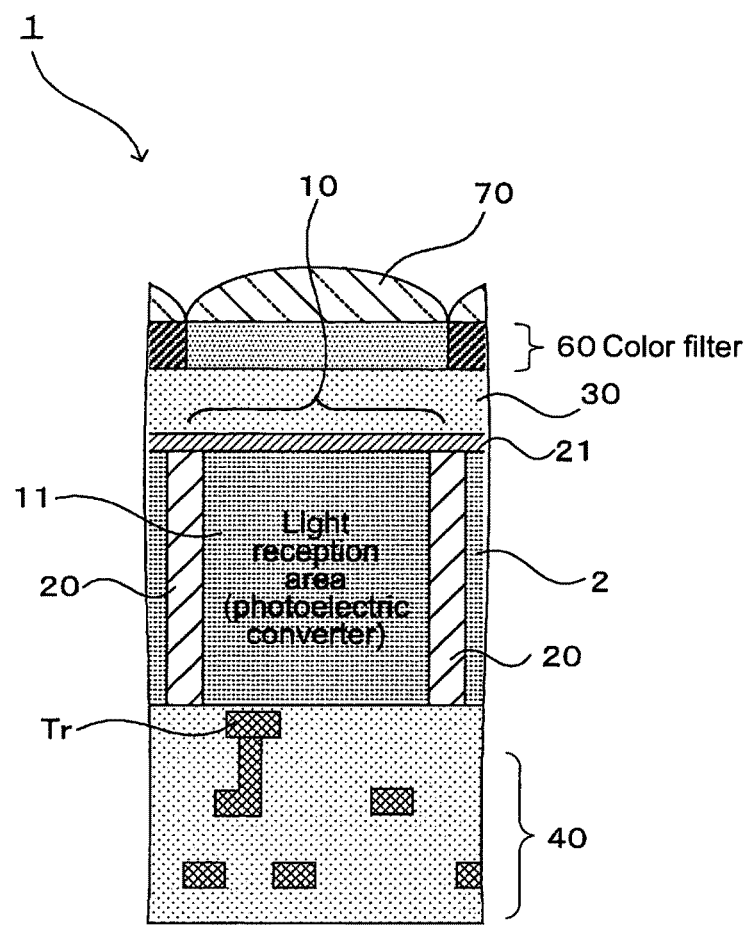
FIG. 2 is a schematic cross-sectional diagram for explaining a structure of the solid-state image pickup apparatus provided with a color filter.

FIG. 2 is a schematic cross-sectional diagram for explaining a structure of the solid-state image pickup apparatus provided with a color filter. As in the solid-state image pickup apparatus shown in FIG. 1, the solid-state image pickup apparatus shown in FIG. 2 is also the so-called CMOS image sensor of a back-surface irradiation type.

That is, in the solid-state image pickup apparatus 1, one side (upper side in FIG. 1) of the substrate 2 made of silicon or the like, in which the light reception area that forms a pixel 10 is provided, corresponds to a light incident side. On the other side of the substrate 2, the wiring layer 40 for a signal obtained by performing photoelectric conversion in the light reception area 11 is provided. With this structure, light enters the surface opposite to the surface on which the wiring layer 40 is provided and is subjected to the photoelectric conversion in the light reception area.

In the solid-state image pickup apparatus 1, the light reception area formed in the substrate 2 is separated by the element separation portion 20. On the light reception area, a color filter 60 is formed through the antireflection film 21 and the adjustment film 30. The color filter 60 is disposed in accordance with the position of the light reception area 11 so as to correspond to one of or each of colors of R (red), G (green), and B (blue). On the color filter 60, the micro lens 70 is provided.

To manufacture the CMOS image sensor of a back-surface irradiation type that is provided with the color filter 60, on the surface (lower side in FIG. 2) of the substrate 2, the element separation region 20 that separates the light reception area 11 is formed by performing the P-type ion implantation. Then, the light reception area 11 is formed between the element separation regions 20 by performing the ion implantation of the N-type and P-type impurities. Further, on the substrate 2, the transistor Tr for the pixel drive or the like and the wiring layer 40 are formed.

The transistor Tr includes various transistors such as the read transistor, the amplifier transistor, the selection transistor, and the reset transistor. The read transistor reads a charge taken in the light reception area 11. The amplifier transistor amplifies an output of a photodiode. The selection transistor selects a photodiode. The reset transistor discharges charges.

In this state, the support substrate is bonded on the side of the substrate 2, on which the wiring layer 40 is formed. In the state of being supported by the support substrate, the back surface (upper side in FIG. 2) of the substrate 2 is polished by a CMP (chemical mechanical polishing). The polishing process is continued until the light reception area 11 is exposed.

Subsequently, on the back surface of the substrate 2, from which the light reception area 11 is exposed, the antireflection film 21 (for example, HfO having the thickness of 64 nm) is formed, and the adjustment film 30 is formed.

Further, on the adjustment film 30, the color filter 60 (having a thickness of 500 nm, for example) is formed, and the micro lens 70 (having a lens thickness of 350 nm, for example) is formed so as to correspond to the color filter 60.

As a result, the solid-state image pickup apparatus 1 in which light enters the back surface (upper side in FIG. 2) of the substrate 2 and is collected by the micro lens 70, and light of a corresponding color is received by the light reception area 11 through the color filter 60 is completed. In this structure, the wiring layer 40 is not provided on the light incident side of the light reception area 11, and therefore the aperture efficiency of each of the light reception areas 11 can be increased.

The solid-state image pickup apparatus provided with the color filter 60 is also characterized in that the impedance matching of the structure is performed by the adjustment film 30 provided between the micro lens 70 and the light reception area 11. In this embodiment, with this structure in which the matching is conducted in accordance with a waveband of light handled in the solid-state image pickup apparatus, a higher light reception sensitivity is obtained as compared to a solid-state image pickup apparatus without the structure as described above.

<2. Features of Embodiment>

Hereinafter, the adjustment film that is a feature of this embodiment will be described. Either one of the structures of FIGS. 1 and 2 may be used for the solid-state image pickup apparatus of this embodiment. In the following description, the CMOS image sensor of a back-surface irradiation type that has no color filter shown in FIG. 1 is used as an example.

(Structure of Adjustment Film)

Figure 3:
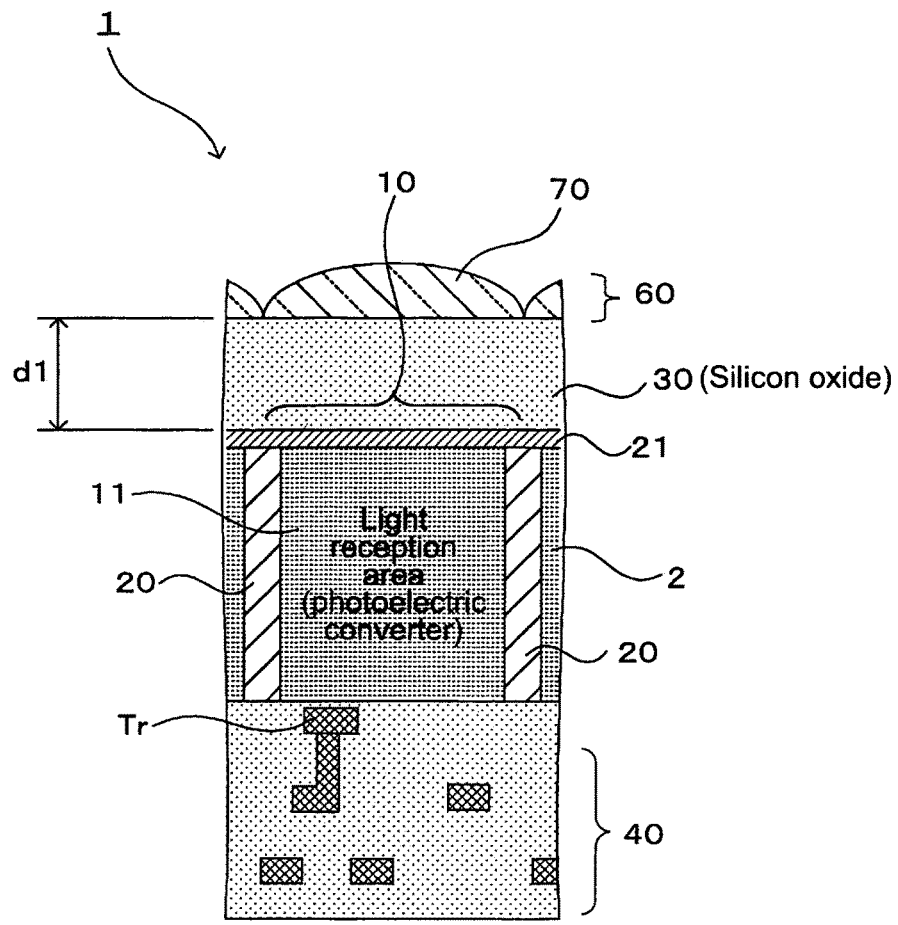
FIG. 3 is a schematic cross-sectional diagram showing an example in which a silicon oxide is used for an adjustment film of the solid-state image pickup apparatus according to the embodiment.

FIG. 3 is a schematic cross-sectional diagram showing an example in which a silicon oxide is used for the adjustment film of the solid-state image pickup apparatus 1 of this embodiment. That is, the solid-state image pickup apparatus 1 includes the adjustment film 30 made of a silicon oxide on the one side (light incident side) of the light reception area 11 as the photoelectric converter provided in the substrate 2 made of silicon or the like. The adjustment film 30 is provided between the micro lens 70 and the antireflection film 21 formed on the light reception area 11 and has a predetermined thickness of d1.

Here, the antireflection film 21 is made of a hafnium oxide (HfO) and has a thickness of 64 nm. On the adjustment film 30 made of a silicon oxide, the micro lens 70 having a height of 750 nm is formed. On the other side (lower side in FIG. 3) of the substrate 2, the transistor Tr and the wiring layer 40 are formed.

In the case where a silicon oxide is used for the adjustment film 30 of the solid-state image pickup apparatus 1 having the above structure, the thickness d1 of the adjustment film 30 is set to 2000 nm or more. The reason why the thickness of 2000 nm is desirable in the case where the adjustment film 30 is made of a silicon oxide will be described later.

Figure 4:
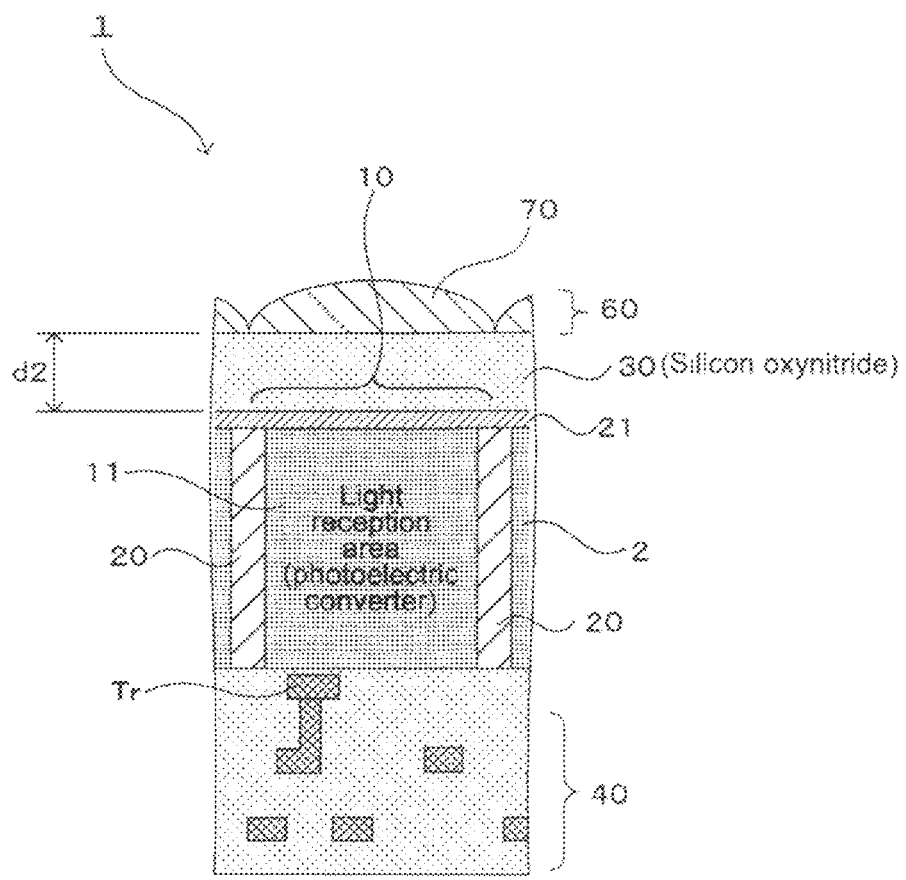
FIG. 4 is a schematic cross-sectional diagram showing an example in which a silicon oxynitride is used as the adjustment film of the solid-state image pickup apparatus according to the embodiment.

FIG. 4 is a schematic cross-sectional diagram showing an example in which a silicon oxynitride is used for the adjustment film of the solid-state image pickup apparatus of this embodiment. In the same way as the solid-state image pickup apparatus shown in FIG. 3, the solid-state image pickup apparatus 1 in this example includes the adjustment film 30 on one side (light incident side) of the light reception area 11 that is the photoelectric converter provided in the substrate 2 made of silicon or the like. The adjustment film 30 is provided between the micro lens 70 and the antireflection film 21 formed on the light reception area 11. The adjustment film 30 is made of a silicon oxynitride and has a predetermined thickness of d2.

Here, the antireflection film 21 is made of a hafnium oxide (HfO) and has the thickness of 64 nm. On the adjustment film 30 made of a silicon oxynitride, the micro lens 70 having the height of 750 nm is formed. On the other hand, on the other side (lower side in FIG. 4) of the substrate 2, the transistor Tr and the wiring layer 40 are formed.

In the case where a silicon oxynitride is used for the adjustment film 30 of the solid-state image pickup apparatus 1 having the above structure, the thickness d2 of the adjustment film 30 is set to 1622 nm or more. As a result, the same structure impedance matching can be conducted as in the case where the adjustment film 30 is made of a silicon oxide having the thickness of 2000 nm.

(Structure Impedance Matching)

Figure 5:
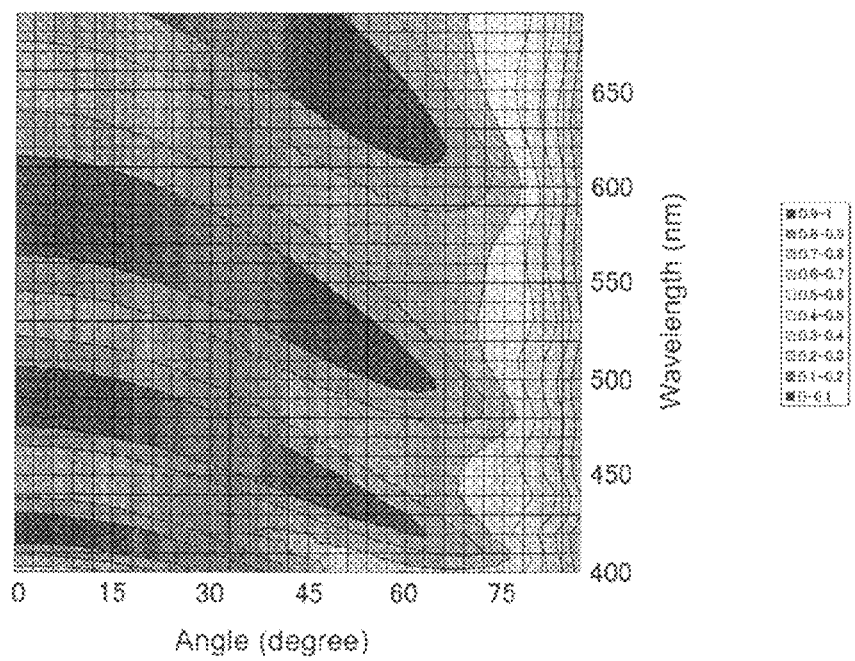
FIG. 5 is a graph showing a structure impedance characteristic of a CMOS image sensor of a back-surface irradiation type in a case where the adjustment film is not provided unlike the embodiment.

FIG. 5 is a graph showing a structure impedance characteristic of a CMOS image sensor of a back-surface irradiation type in a case where the adjustment film is not provided unlike this embodiment. In FIG. 5, a lateral axis corresponds to angles of incident light with respect to an optical axis of a micro lens (optical direction: 0 degree, direction perpendicular to the optical axis: 90 degrees), and a vertical axis corresponds to wavelengths of the incident light. A distribution in the figure shows a transmittance of light, that is, a rate at which light that enters the micro lens reaches the photoelectric converter (light reception area).

In the solid-state image pickup apparatus that does not include the adjustment film, the transmittance of light significantly fluctuates depending on the wavelengths and angles due to an influence of structure impedance mismatching.

Figure 6:
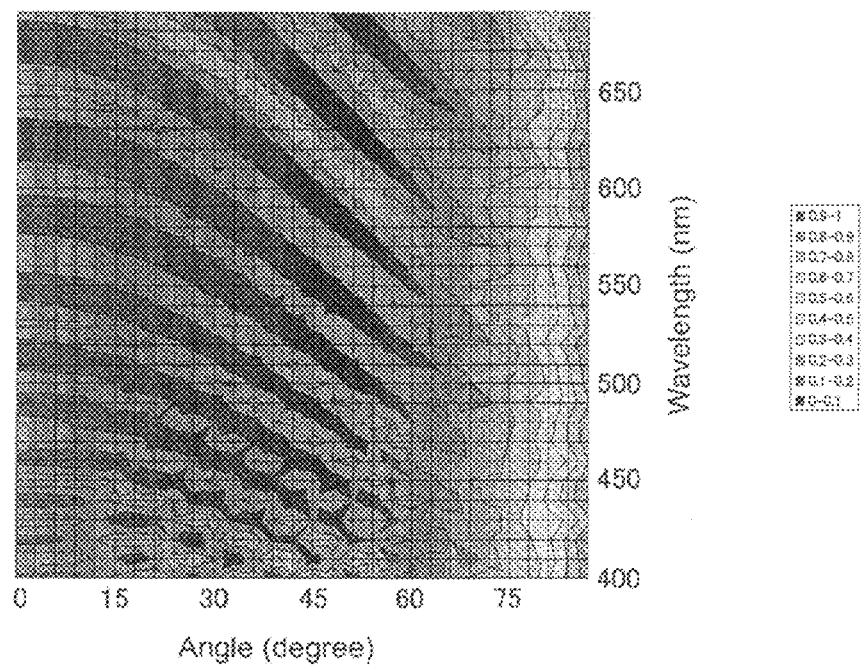
FIG. 6 is a graph showing a structure impedance characteristic in a case where an adjustment film made of a silicon oxide is provided.

FIG. 6 is a graph showing a structure impedance characteristic in the case where the adjustment film made of a silicon oxide is provided. Also, in FIG. 6, a lateral axis corresponds to angles of incident light with respect to an optical axis of a micro lens (optical axis direction: 0 degree, direction perpendicular to the optical axis: 90 degrees), and a vertical axis corresponds to wavelengths of the incident light. A distribution in the figure shows a transmittance of light, that is, a rate at which light that enters the micro lens reaches the photoelectric converter (light reception area).

The adjustment film made of a silicon oxide has the thickness of 2000 nm. When the adjustment film made of a silicon oxide having the thickness is provided, a frequency of the fluctuation of the transmittance of light with respect to the wavelengths and angles is increased as compared to the case where the adjustment film is not provided shown in FIG. 5.

Figure 7:
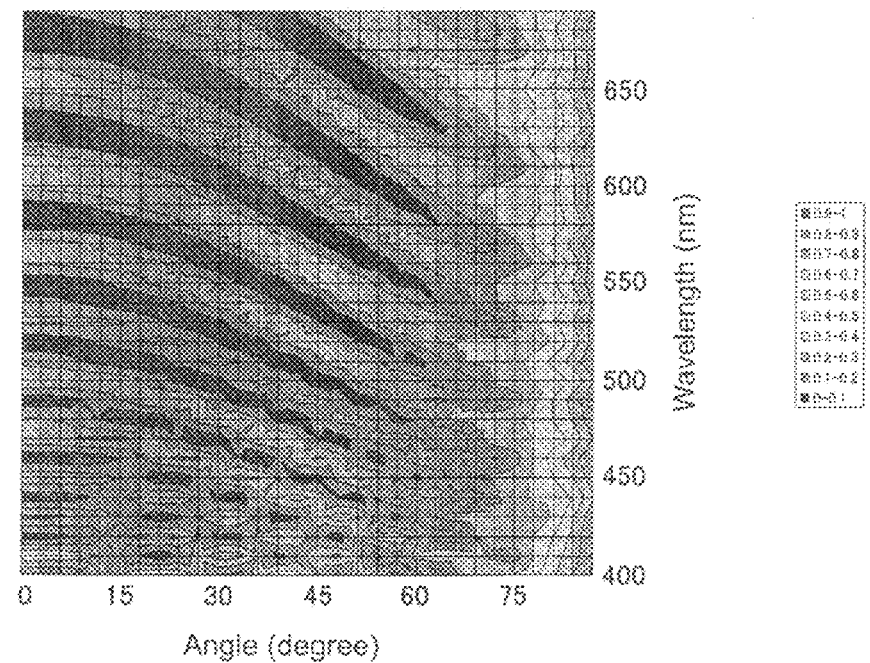
FIG. 7 is a graph showing a structure impedance characteristic in a case where an adjustment film made of a silicon oxynitride is provided.

FIG. 7 is a graph showing a structure impedance characteristic in the case where the adjustment film made of a silicon oxynitride is provided. Also, in FIG. 7, a lateral axis corresponds to angles of incident light with respect to an optical axis of a micro lens (optical direction: 0 degree, direction perpendicular to the optical axis: 90 degrees), and a vertical axis corresponds to wavelengths of the incident light. A distribution in the figure shows a transmittance of light, that is, a rate at which light that enters the micro lens reaches the photoelectric converter (light reception area).

The adjustment film made of a silicon oxynitride has the thickness of 1622 nm. When the adjustment film made of a silicon oxynitride having the thickness is provided, a frequency of the fluctuation of the transmittance of light with respect to the wavelengths and angles is increased as compared to the case where the adjustment film shown in FIG. 5 is not provided. In addition, the structure impedance characteristic that is the same as the case where the adjustment film made of a silicon oxide shown in FIG. 6 is obtained.

It should be noted that the adjustment film made of a silicon oxide shown in FIG. 6 and the adjustment film made of a silicon oxynitride shown in FIG. 7 have relatively similar matching at the incident angle of 0 degree. However, the adjustment film made of a silicon oxynitride shows smaller fluctuations of the transmittance depending on the incident angles as compared to the adjustment film made of a silicon oxide.

Figure 8:
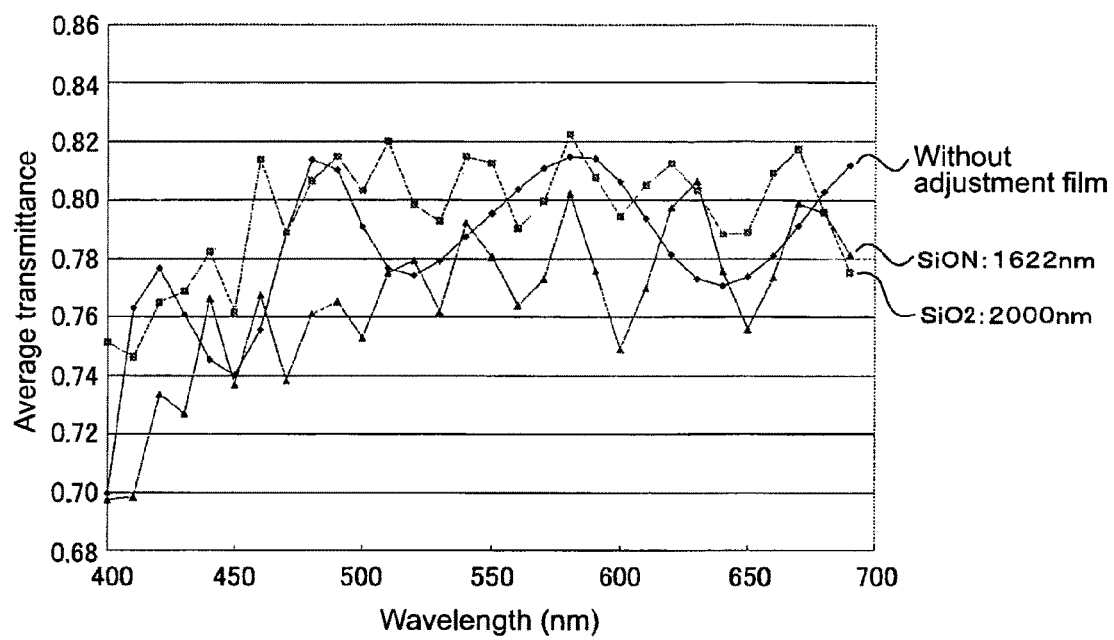
FIG. 8 is a graph showing an average transmittance with respect to a wavelength.

FIG. 8 is a graph showing an average transmittance with respect to the wavelength. In FIG. 8, a lateral axis corresponds to a wavelength, and a vertical axis corresponds to an average transmittance. FIG. 8 shows the case of the structure without the adjustment film, the case of the structure with the adjustment film made of a silicon oxide, and the case of the structure with the adjustment film made of a silicon oxynitride. It should be noted that the average transmittance is obtained by averaging the transmittances at the incident angles from 0 to 90 degrees every 10-nm wavelengths.

The structure without the adjustment film has a larger period of fluctuation of the average transmittance with respect to the wavelength and has larger amplitude than the structure with the adjustment film. Here, a maximum period of the amplitude is larger than a distance between a center wavelength (for example, 450 nm) of blue light and a center wavelength (for example, 540 nm) of green light. Therefore, when the solid-state image pickup apparatus receives light in a blue band and light in a green band, a difference of light reception sensitivities becomes obvious.

On the other hand, the structure with the adjustment film has a smaller period of fluctuation of the average transmittance with respect to the wavelength and smaller amplitude as compared to the structure without the adjustment film. Here, a maximum period of amplitude is smaller than the distance between the center wavelength (for example, 450 nm) of blue light and the center wavelength (for example, 540 nm) of green light. Therefore, when the solid-state image pickup apparatus receives light in a blue band and light in a green band, a difference of the light reception sensitivities is averaged. Further, a difference of the amplitudes is also smaller, and therefore a difference of the light reception sensitivities becomes small in any waveband.

It should be noted that the structure with the adjustment film made of a silicon oxide can maintain a high transmittance while keeping a wavelength dependence small, as compared to the structure with adjustment film made of a silicon oxynitride.

(Thickness of Silicon Oxide)

Figure 9:
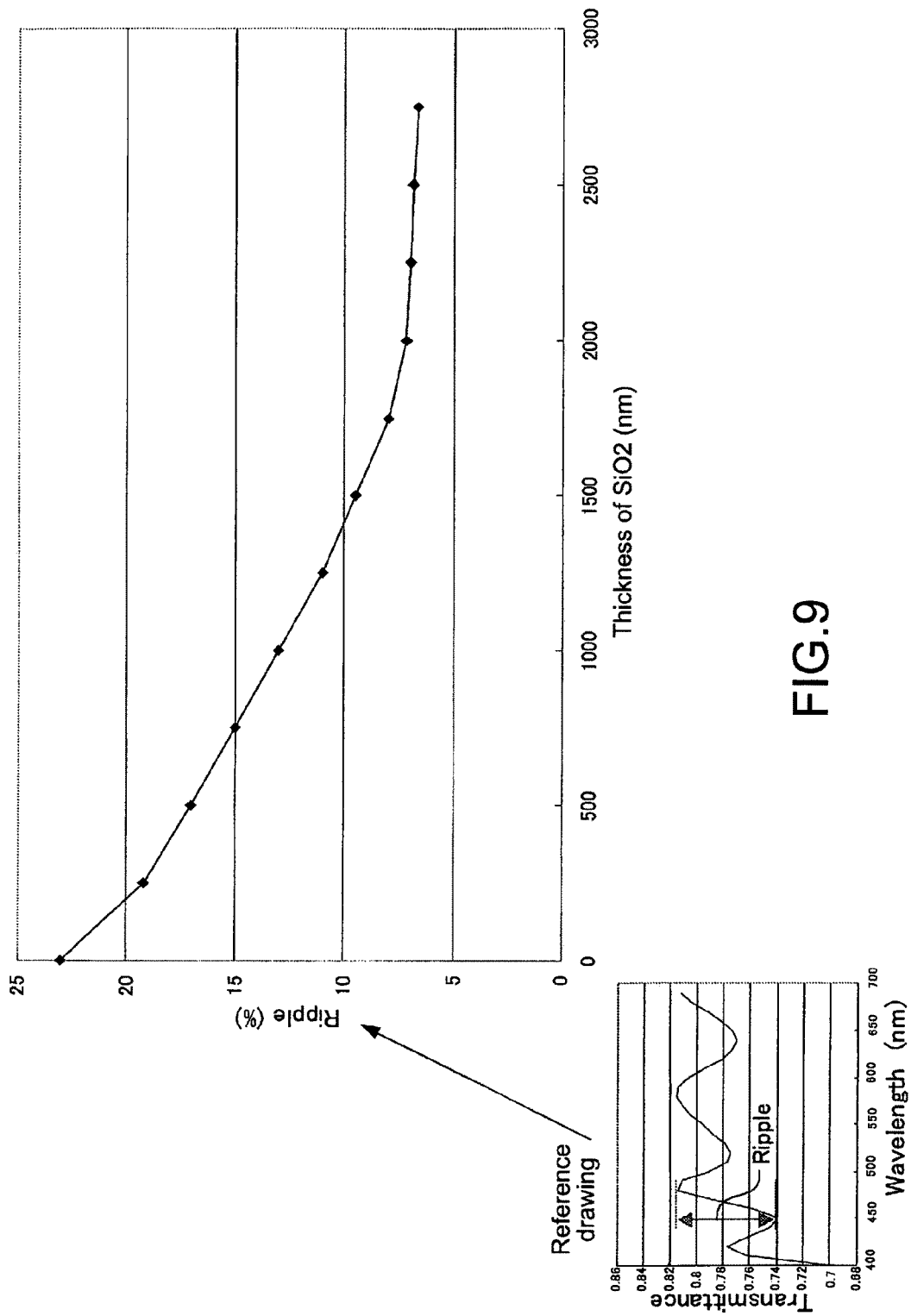
FIG. 9 is a graph showing a relationship between a thickness of the adjustment film made of a silicon oxide and maximum amplitude (ripple) of a light reception sensitivity.

FIG. 9 is a graph showing a relationship between a thickness of the adjustment film made of a silicon oxide and the maximum amplitude (ripple) of a light reception sensitivity. Here, the maximum amplitude (ripple) will be explained by using a reference drawing in FIG. 9. In the reference drawing in FIG. 9, the relationship between the wavelength (lateral axis) and the average transmittance (vertical axis) is shown as in FIG. 8. In this relationship, a difference of average transmittances between adjacent inflection points is referred to as a ripple.

FIG. 9 shows how the ripple changes with respect to the thickness of the adjustment film made of a silicon oxide. As the thickness of the adjustment film is larger, the ripple becomes smaller. When the thickness of the adjustment film becomes 2000 nm or more, the ripple almost reaches a saturation point. This result shows that the thickness of the adjustment film made of a silicon oxide is desirably set to 2000 nm or more.

(Structure of Antireflection Film)

Figure 10:
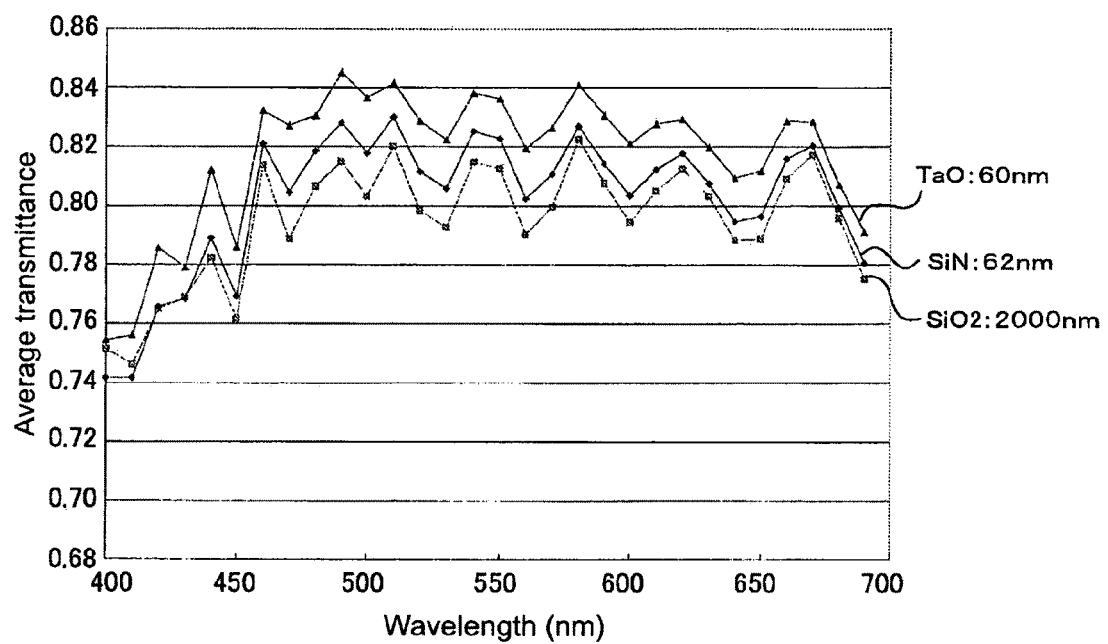
FIG. 10 is a graph showing an average transmittance with respect to a wavelength depending on materials of an antireflection film.

FIG. 10 is a graph showing an average transmittance with respect to a wavelength depending on materials of the antireflection film. In the solid-state image pickup apparatus according to this embodiment, the antireflection film is provided between the light reception area and the adjustment film and is made of a hafnium oxide (HfO). Instead of a hafnium oxide (HfO), a silicon nitride (SiN) or a tantalum oxide (TaO) may be used as the antireflection film.

FIG. 10 shows an average transmittance with respect to a wavelength in each of cases where a hafnium oxide (HfO) having a thickness of 64 nm, silicon nitride (SiN) having a thickness of 62 nm, and a tantalum oxide (TaO) having a thickness of 60 nm are used as the antireflection film. It should be noted that a film structure on the antireflection film includes the adjustment film made of a silicon oxide having the thickness of 2000 nm and the micro lens having the height of 750 nm.

As shown in FIG. 10, in the case where a silicon nitride (SiN) or a tantalum oxide (TaO) is used as the antireflection film, a high average transmittance can also be maintained in a visible light area, as in the case where a hafnium oxide (HfO) is used.

<3. Electronic Apparatus>

Figure 11:
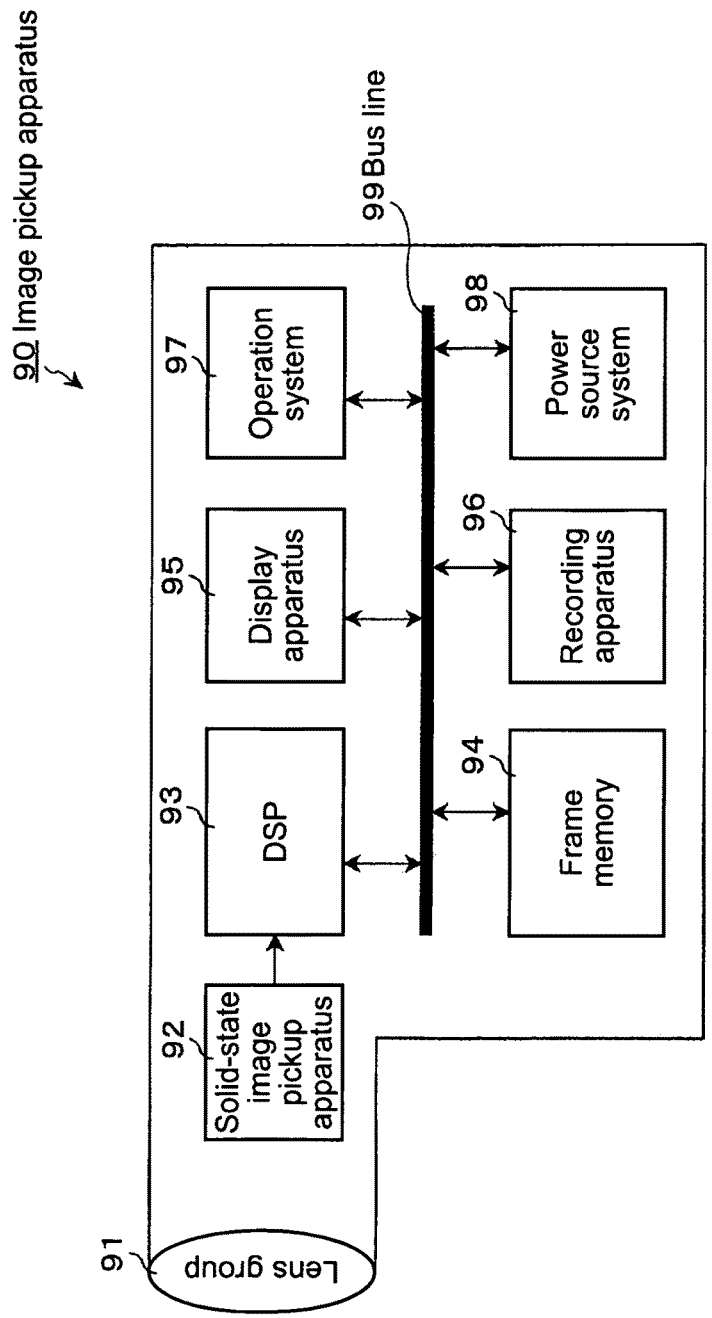
FIG. 11 is a block diagram showing a structural example of an image pickup apparatus as an example of an electronic apparatus according to the embodiment.

FIG. 11 is a block diagram showing a structural example of an image pickup apparatus as an electronic apparatus according to this embodiment. An image pickup apparatus 90 shown in FIG. 11 includes an optical system having a lens group 91, a solid-state image pickup apparatus 92, a DSP circuit 93 as a camera signal processing circuit, a frame memory 94, a display apparatus 95, a recording apparatus 96, an operation system 97, and a power source system 98. Among those components, the DSP circuit 93, the frame memory 94, the display apparatus 95, the recording apparatus 96, the operation system 97, and the power source system 98 are mutually connected through a bus line 99.

The lens group 91 collects incident light (image light) from a subject and forms an image on an imaging surface of the solid-state image pickup apparatus 92. The solid-state image pickup apparatus 92 converts a light amount of the incident light that is imaged on the imaging surface by the lens group 91 into an electrical signal for each pixel, and outputs it as a pixel signal. As the solid-state image pickup apparatus 92, the structure of the solid-state image sensor of this embodiment described above is used.

The display apparatus 95 is formed of a panel-type display apparatus such as a liquid crystal display apparatus and an organic EL (electro-luminescence) display apparatus, and displays a moving image or a still image taken by the solid-state image pickup apparatus 92. The recording apparatus 96 records the moving image or the still image taken by the solid-state image pickup apparatus 92 on a recording medium such as a non-volatile memory, a videotape, and a DVD (digital versatile disk).

The operation system 97 gives operation commands for various functions of the image pickup apparatus 90 under the control of a user. The power source system 98 appropriately supplies various power sources as operation sources to the DSP circuit 93, the frame memory 94, the display apparatus 95, the recording apparatus 96, and the operation system 97.

The image pickup apparatus 90 as described above is applied to a camera module for a mobile apparatus, such as a video camera, a digital still camera, and a camera cellular phone. By using, as the solid-state image pickup apparatus 92, the solid-state image pickup apparatus according to this embodiment described above, the image pickup apparatus excellent in color balance can be provided.

Further, an electronic apparatus using a solid-state image pickup apparatus according to this embodiment that is not provided with a color filter shown in FIG. 1 may be applied to a three-plate-type image pickup apparatus that uses three solid-state image pickup apparatuses corresponding to colors of R (red), G (green), and B (blue). In the three-plate-type image pickup apparatus, imaging-target light is dispersed into the colors of RGB by a dichroic mirror or the like and caused to enter solid-state image pickup apparatuses corresponding to the colors, thereby taking an image corresponding to the colors by the solid-state image pickup apparatuses.

In any electronic apparatuses, the fluctuation of the light reception sensitivity with respect to the wavelength can be suppressed, and an image excellent in color balance can be obtained.

The present application contains subject matter related to that disclosed in Japanese Priority Patent Application JP 2009-084143 filed in the Japan Patent Office on Mar. 31, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus, comprising:
a photoelectric converter formed on a light incident side in a substrate;
a wiring portion formed on a side of the substrate that is opposite to the light incident side;
a micro lens formed on a light incident side of the photoelectric converter; and
an adjustment film to adjust variation of light reception sensitivities in the photoelectric converter with respect to wavelengths of light that enter the photoelectric converter through the micro lens, the adjustment film being formed between the photoelectric converter and the micro lens and being in contact with the micro lens and an antireflection film;
wherein the adjustment film provides a transmittance that has a period between successive amplitude peaks in an average transmittance of light through the adjustment film measured at 10 nm wavelength intervals, the period being shorter than a wavelength difference between a center wavelength of blue light and a center wavelength of green light, the transmittance being a rate at which light incident at 0 to 90 degrees with respect to an optical axis of the micro lens reaches the photoelectric converter, and
wherein when the solid-state image pickup apparatus receives light in a blue band and a green band, a difference of the light reception sensitivities is averaged.

2. The solid-state image pickup apparatus according to claim 1,
wherein the adjustment film is made of one of a silicon oxide and a silicon oxynitride.

3. The solid-state image pickup apparatus according to claim 1,
wherein the adjustment film is made of a silicon oxide and has a thickness of 2000 nm or more.

4. The solid-state image pickup apparatus according to claim 1, wherein the antireflection film is provided between and in contact with the adjustment film and the substrate.

5. An electronic apparatus, comprising:
a solid-state image pickup apparatus to output an electrical signal corresponding to a reception light amount, the solid-state image pickup apparatus including a photoelectric converter formed on a light incident side in a substrate, a wiring portion formed on a side of the substrate that is opposite to the light incident side, a micro lens formed on a light incident side of the photoelectric converter, and an adjustment film to adjust fluctuation of light reception sensitivities in the photoelectric converter with respect to wavelengths of light that enter the photoelectric converter through the micro lens, the adjustment film being formed between the photoelectric converter and the micro lens and being in contact with the micro lens and an antireflection film; and
wherein the adjustment film provides a transmittance that has a period between successive amplitude peaks in an average transmittance of light through the adjustment film measured at 10 nm wavelength intervals, the period being shorter than a wavelength difference between a center wavelength of blue light and a center wavelength of green light, the transmittance being a rate at which light incident at 0 to 90 degrees with respect to an optical axis of the micro lens reaches the photoelectric converter, and
wherein when the solid-state image pickup apparatus receives light in a blue band and a green band, a difference of the light reception sensitivities is averaged.

6. The electronic apparatus according to claim 5,
wherein the adjustment film is made of one of a silicon oxide and a silicon oxynitride.

7. The electronic apparatus according to claim 5,
wherein the adjustment film is made of a silicon oxide and has a thickness of 2000 nm or more.

8. The electronic apparatus according to claim 5, wherein the antireflection film is provided between and in contact with the adjustment film and the substrate.

* * * * *